United States Patent [19]

Morgan, Jr.

[11] Patent Number: 4,553,835
[45] Date of Patent: Nov. 19, 1985

[54] PROCESS FOR PRODUCING PRE-PRESS COLOR PROOFS

[76] Inventor: James T. Morgan, Jr., 1914 Stark Ave., Columbus, Ga. 31906

[21] Appl. No.: 626,134

[22] Filed: Jun. 29, 1984

Related U.S. Application Data

[63] Continuation-in-part of Ser. No. 347,893, Feb. 11, 1982, abandoned.

[51] Int. Cl.$^4$ ............... G03B 27/32; G03B 27/72; G03B 27/76
[52] U.S. Cl. ............................ 355/77; 355/35
[58] Field of Search .............. 355/32, 35, 132, 77, 355/71, 88; 358/299, 302

[56] References Cited

U.S. PATENT DOCUMENTS 3,627,908 12/1971 Dailey .................... 355/32 X
4,385,828  5/1983 Prentice .................. 355/32 X
4,395,116  7/1983 Patton, III et al. ............. 355/32

Primary Examiner—Richard A. Wintercorn
Attorney, Agent, or Firm—Schmidt, Johnson, Hovey & Williams

[57] ABSTRACT

A process is disclosed for preparing a pre-press proof of an original subject having highlight, midtone and shadow tone areas using a color print paper wherein the dyes of the print paper are brought into substantial color compliance with the yellow, cyan and magenta process inks to be used in producing a lithographic reproduction of the original subject. The tonal range of the proof image is also extended to closely match that of the final printed product. After determining the densitometer readings for yellow, magenta and cyan through blue, green and red filters respectively for the print paper and the process inks, the print paper is exposed to light through each filter with an appropriate color separation halftone negative over the film and with combinations of filters being used for hue correction of the yellow, magenta and cyan film dye coupling dyes. A masked short scale yellow separation halftone negative is used to prepare a dye transfer matrix thereof, the image defining portions of tee matrix are dyed with a yellow transfer dye and the yellow is then transferred to the print paper sheet since the yellow coupling dye of the print paper has an excess of magenta and will not provide a true lemon-yellow color in the proof. Exposure of the print paper through color separation positives along with the same separation negatives through corresponding filters provides tone balance and allows compensation for dot gain in printing.

12 Claims, 12 Drawing Figures

PROCESS FOR PRODUCING PRE-PRESS COLOR PROOFS

This application is a continuation-in-part of application Ser. No. 347,893, filed Feb. 11, 1982 now abandoned entitled PROCESS FOR PRODUCING PRE-PRESS COLOR PROOFS.

BACKGROUND OF THE INVENTION

1. Field of the Invention

This invention relates to a combination of dye coupling and dye transfer process for preparing a pre-press proof of original artwork using color print paper wherein the dyes of the film are brought into substantial color compliance insofar as contaminants are concerned, the color is fully corrected and the tonal range is equivalent to that of the yellow, cyan and magenta process inks used in producing a lithographic reproduction of the artwork.

The present process permits preparation of a pre-press color proof on photographic color paper developed in dye coupler developer wherein dye transfer colors in a separate operation are combined with the print film dyes to accomplish a hue match with the hue of each process ink color used to produce the original artwork on a printing press. By use of halftone color separations made on an electronic color scanner (or a halftone process color camera), pre-press color proofs employing color print paper may be prepared utilizing the color corrected halftone separation negatives and positives.

2. Description of the Prior Art

It has long been the practice in the lithographic field to provide pre-press proofs before preparing plates for printing. The proofs permit the printer to preview his final product before going to the time and expense of etching the press plates which are difficult and often impossible to alter or revise. Furthermore, all corrections necessary insofar as color balance, color correction and compensation for hue errors in the process inks may be made before the plates are prepared and placed on the press for final mass printing. It is often desirable in the printing trade to furnish the purchaser an exact sample of what the finished printed product will look like for approval before actually printing the job.

In the art to which my invention relates, it is both customary and desirable to provide pre-press proofs from an electronic color separation scanner (or camera) set of halftones separations before preparing plates for printing using the same halftone negatives and positives which will be used to make the printing plates. One reason for requiring pre-press proofs is that it permits the craftsman printer to have a preview of his final product made from his color scanner separation halftones and also permits him to make any corrections on his halftone negatives and positives prior to producing the plates for printing.

Electronic color separation scanners split a beam of light into red, green and blue components. The scanner produces halftone negatives (and/or positives) which are not only color corrected but also function as color separations to prepare plates for printing with yellow, magenta and cyan process inks. The present invention is functional to produce pre-press color proofs from color print paper utilizing halftone color separations which are produced by an electronic scanner or process color camera.

Various processes have been proposed in the past for producing pre-press proofs from halftone separation positives and/or negatives. By way of example, the E. I. DuPont de Nemours Company of Wilmington, Del., has developed a pre-press proofing process called "Cromalin" which utilizes powdered pigment toners. While this process is satisfactory in many respects, Cromalin requires the user to purchase and employ various types of expensive equipment. Further, this equipment requires the use of costly materials and highly trained operators. A health hazard can exist as powdered pigments are dusted onto a photopolymer base and pollute the air in the confined processing area which must be air conditioned to a constant temperature of 72° and 50% R.H.

In like manner and further by way of example, the Minnesota Mining and Manufacturing Company of Minneapolis, Minn., has developed a pre-press proofing process utilizing halftone separation negatives called "Color Key" which results in the production of three overlay layers of colored plastic sheets. This company also produces a pre-press process designated "Transfer Key". Both of these systems use halftone separation negatives (or positives) and require the purchase and use of toned or colored overlay sensitized plastic sheets corresponding to the four process colors which are supposed to match the inks to be used in printing. In practice, however, these sheets usually do not sufficiently correspond to the actual ink color hues. With regard to the "Color Key" process, the use of three or four different plastic sheet overlays is required, one overlay from each of the four separation negatives (or positives), possibly resulting in distortion of the proof.

Eastman Kodak promoted a pre-press color proofing process utilizing color print paper but no compensation was provided for extended tone range or color differences between the process inks and inherent errors in the print paper dyes as compared with the process ink hue errors. The process is described in an Eastman Publication No. 118 issued in 1965.

A more recent example of the prior art is a process offered by the Keuffel & Esser Company of Morristown, N.J., called "Spectra" which also utilizes powder color pigment toners. This process is generally similar to the above-described "Cromalin" process and is subject generally to the same objections and criticisms.

SPECIFIC OBJECTS OF THE INVENTION

In view of the foregoing, a prime object of the present invention is to provide a process for producing pre-press color proofs from halftone separation negatives and positives, previously prepared on a scanner or camera, which is accurate, relatively inexpensive and quick, using no powdered color toners and which may be carried out by relatively unskilled personnel, requiring no special work area with temperature and humidity controls.

Another object of the present invention is to provide a process of the character designated employing equipment which a printer usually has on hand in his shop and that utilizes materials which are readily available on the open market.

Another object is to provide a process in which the overall time for preparing a high quality pre-press proof from color print paper that can shorten the time required as compared with prior art processes.

Another object of the present invention is to produce pre-press color proofs from halftone separation negatives and positives by a process which is on paper that is similar in texture, feel and appearance with the actual printing paper—there are no pigmented powders and no overlay sheets.

SUMMARY OF THE INVENTION

The present process provides a method of preparing a pre-press proof of original artwork having highlight and shadow tone areas using conventional color print paper wherein the dyes of the print paper are brought into substantial color compliance with the yellow, cyan and magenta process inks used in producing a lithographic reproduction of the original art, while at the same time extending the tonal range of the proof colors to that of a printed sheet.

First, yellow, cyan and magenta color halftone separation negatives and positives are prepared of the original artwork using a color scanner or a process color camera. The halftone negatives are placed in sequential order over a sheet of color print paper which is sensitive to red, green and blue light respectively.

The film is exposed to light passed through a blue filter when the yellow separation negative is over the print paper, a red filter when the cyan separation negative is over the print paper, and a green filter when the magenta separation negative is placed over the print paper. Means is provided to assure registration of the halftone separation negatives with the print paper sheet for all of the sequential exposures.

Each of the halftone negative overlay exposures of the film sheet is carried out for a predetermined time period sufficient to cause the dyes of the print paper sheet upon development thereof to exhibit densitometer readings wherein through a blue filter, the yellow reading of the exposed print paper sheet relatively closely matches the yellow reading obtained by densitometer measurement through a blue filter of the yellow process ink, through a green filter the magenta reading of the exposed print paper relatively closely matches the magenta reading obtained by densitometer measurement through a green filter of the magenta process ink, and through a red filter the cyan reading of the exposed print paper relatively closely matches the cyan reading obtained by densitometer measurement through a red filter of the cyan process ink.

During exposure of the print paper sheet to light through a red filter while the cyan separation negative is over the print paper sheet, the latter is also exposed to light through a green filter for a sufficient period of time to cause the dyes of the print paper sheet upon development thereof to exhibit a densitometer reading wherein the magenta reading through a green filter relatively closely matches the magenta contaminant reading obtained by densitometer measurement through a green filter of the cyan process ink.

In addition, during exposure of the print paper sheet to light through a green filter while the magenta separation negative is in place over the print paper sheet, the latter is exposed to light through a blue filter for a sufficient period of time to cause the dyes of the print paper sheet upon development thereof to exhibit a densitometer reading wherein the yellow reading through a blue filter relatively closely matches the yellow contaminant reading obtained by densitometer measurement through a blue filter of the magenta process ink.

The required tonal range of the color print paper proof is obtained by placing on the print paper sheet when the magenta separation negative is associated therewith, the magenta separation positive; and the yellow separation positive on the print paper sheet when the yellow separation negative is associated with the print paper sheet; and the cyan separation positive on the print paper sheet with the cyan separation negative; and in each instance passing additional light through the, green, blue, and red filters respectively for time periods sufficient to cause the highlight areas of the print paper proof to substantially duplicate the highlight areas of the original subject.

Additional light is passed through the red and green filters while respective sandwiches of the cyan negative and the cyan positive and the magenta negative and magenta positive are on the print paper sheet, for a longer period of time than additional light is passed through the blue filter while the yellow negative and yellow positive are on the print paper sheet to extend the tonal range and also increase the dot size of the cyan and magenta halftone dots of the pre-press color proof to substantially simulate the dot sizes thereof in the final production print run, it being known in this respect that these dots increase in size during press operation because of successive overprinting thereof from one printing unit to the next.

Color correction of the print paper proof may optionally be enhanced under certain color requirement conditions by exposing the print paper sheet to light passing through a red filter while the cyan halftone negative and the magenta halftone positive are over the print paper sheet, by exposing the print paper sheet to light passing through a green filter while the magenta halftone negative and the yellow halftone positive are over the print paper sheet, and by exposing the print paper sheet to light passing through a blue filter while the yellow negative and the cyan positive are over the print paper sheet.

The procedures described provide substantial compensation for the fact that the hue errors of dye coupler dyes in conventional color print paper do not match the hue errors of process inks. However, the yellow in a print paper pre-press proof is often too orangish with no way to eliminate the orange and make the yellow hue of lemon-yellow cast because the yellow dye coupler dye has too much magenta content as a contaminant. The present process provides compensation for this yellow dye coupler dye error by preparing a short scale yellow halftone separation negative which carries only the tone ranges from midtones to shadows. A positive of this short scale negative is used for exposure of the print paper sheet along with the full scale yellow separation negative to progressively reduce the yellow shadow tone values of the yellow dye coupler image to approach zero. The short scale yellow shadow halftone negative is also employed to prepare a dye transfer matrix thereof. The positive defining portions of the matrix are dyed with a yellow transfer dye and this yellow dye image is then transferred to the color print paper after dye coupler development thereof. Thus, the midtone areas and the shadow and solid tones of the yellow in the pre-press proof are lemon-yellow rather than being somewhat orangish, providing a more accurate representation of the yellow colors obtained upon printing of the artwork.

The dye transfer procedure may also be employed in similar fashion to improve the magenta hue image. In this instance, a short scale halftone shadow magenta positive is placed over the full scale halftone magenta negative, and the print paper exposed to progressively reduce the magenta shadow tone values of the magenta dye coupler image to approach zero in the darkest areas. In addition, a matrix is made from the short scale magenta halftone negative, the image defining areas of the matrix are dyed with a pure magenta dye and then the magenta dye image transferred to the color print paper after dye coupler development. In this manner, an exact match of the tone range and hue of the magenta printing ink is obtained. Although rarely required, the same can be done if desired with respect to the cyan.

DETAILED DESCRIPTION OF THE PREFERRED EMBODIMENT

Figure 1:
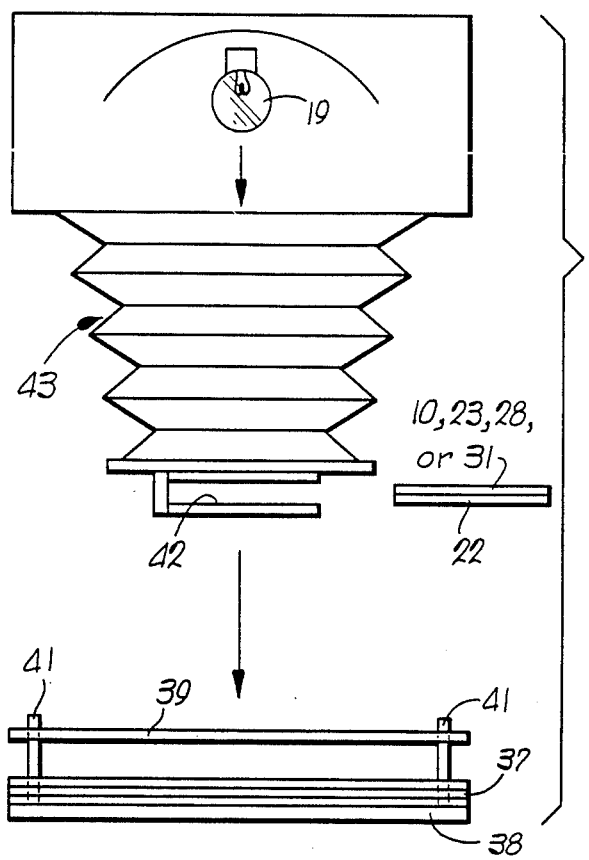
FIG. 1 is a wholly diagrammatic partially exploded view of a diffused white light source such as a quartz halogen bulb, in position to expose a sheet of color print paper through a negative half tone, some of the parts being shown in section, the thickness of the color print paper and negative print being greatly exaggerated.

In carrying out the present invention, commercially available photographic color print paper may be used which is available from various sources, as for example from Eastman Kodak Company under the designation "Ektacolor" color print paper, or equivalent paper from Minnesota Mining and Manufacturing Company, or Fuji of Japan. Any of these color print papers may be developed in a conventional dye coupling single developer. Using one of the color print papers referenced above in place on a vacuum frame or the like, registered on pins in usual fashion the print paper is sequentially exposed through the halftone color separation negatives employing special light permeable color filter grids or split filters (that is, part of the exposure through one color filter and part of the exposure through a filter of another color). By use of the color grids or split filter, the formed image which is a combination of dye coupler development and subsequent transfer of a transfer dye, the pre-press proof is brought into color hue and tonal range compliance with process printing inks.

Each color of printing ink is contaminated with some of the other two colors. The Lithographers Manual of the Graphic Arts Technical Foundation describes typical process inks as giving densitometer readings as follows (using Kodak Wratten filters, Blue 47B, Green 58 and Red 25):

EXAMPLE I

| Process Inks | Filters | | |
| --- | --- | --- | --- |
| | Red | Green | Blue |
| Yellow | .00 | .10 | 1.20 |
| Magenta | .10 | 1.20 | .60 |
| Cyan | 1.25 | .40 | .28 |
| Yellow | .00 | .10 | 1.20 |
| Magenta | .10 | 1.30 | .70 |
| Cyan | 1.50 | .60 | .30 |

Process inks in use vary somewhat as to hue errors and one exemplary set of inks has been found to exhibit the following densitometer readings:

EXAMPLE II

| Process Inks | Filters | | |
| --- | --- | --- | --- |
| | Red | Green | Blue |
| Yellow | .02 | .06 | 1.20 |
| Magenta | .10 | 1.40 | .52 |
| Cyan | 1.40 | .48 | .06 |

Dyes obtained by developing in a dye coupling developer which are equivalent to those found in conventional color print film have been found to exhibit densitometer readings as follows:

EXAMPLE III

| Process Inks | Filters | | |
| --- | --- | --- | --- |
| | Red | Green | Blue |
| Yellow | .02 | .16 | 1.20 |
| Magenta | .13 | 1.40 | .50 |
| Cyan | 1.40 | .46 | .10 |

It can be seen from the foregoing that although the magenta and cyan readings are somewhat similar the yellow of the dye coupling dye contains too much magenta as compared with the process yellow ink.

The first step for the operator to perform is to determine the strength of the inks to be used when printed and the color contaminants therein. By way of example, the operator may find that his standard density reading for cyan solid swatch is 1.50 when read through the red filter of a densitometer. Also, this same ink solid swatch when read through the green filter, may disclose a density of 0.60 magenta. At the same time this same cyan ink swatch may, by the densitometer reading, disclose the existence of a density of 0.18 of yellow when read through the blue filter. Similarly, the magenta solid swatch examination may show 1.20 when read through the green filter; 0.48 when read through the blue filter and a density of 0.14 cyan when read through the red filter; and, the solid yellow swatch when read through the blue filter disclose a density of 1.20, 0.12 through the green filter, and 0.02 through the red filter.

With regard to the black ink, the densitometer reading may be found to be on the order of 1.50 when read through either the blue, green or red filters.

Following the standard and customary practice in that regard, by use of either camera or color scanner, or by contact, the operator now prepares the usual set of color separation halftone negatives and positives of the subject to be reproduced.

Figure 2:
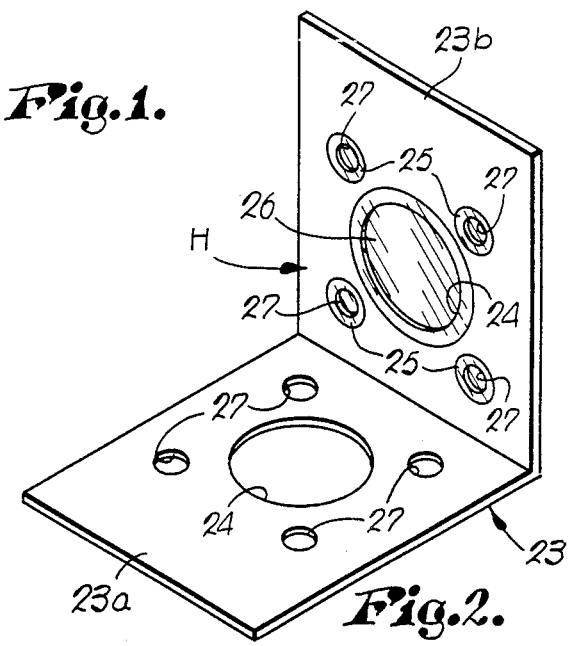
FIG. 2 is an isometric, opened view of a holder for the filters.

Having in hand the information with regard to the degree of contamination of the several inks and a set of halftone positives and negatives to be used in printing, the operator now prepares the filter grids and holders therefor as illustrated diagrammatically in FIGS. 2 to 6, inclusive. First, by way of example, with regard to the holder H illustrated in FIG. 2, material for the holder itself may be a foldable, relatively thin, flat, sheet material, flat black on all surfaces. One of the holders as shown in FIG. 2 is made up for each of the printers as illustrated in FIGS. 3 to 6, inclusive, the only difference being the arrangement of the openings therethrough as will later appear. Filter materials of the colors to be described are secured to the inside surface of one of the leaves of the filter and cover the holes, thus protecting the fragile materials when the leaves are folded.

Figure 5:
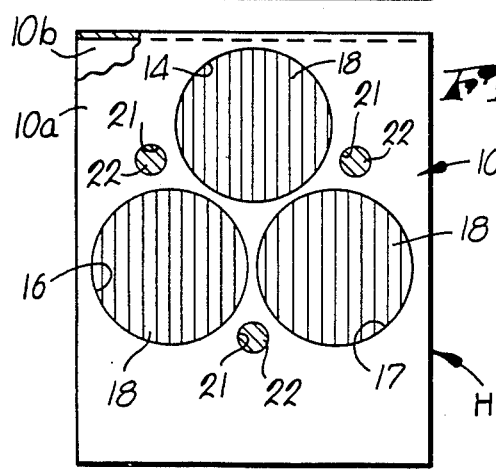

Considering first the construction of the cyan printer grid 10 as shown in FIG. 5, as a matter of convenience both leaves 10a and 10b of the holder H proper may have cut therethrough three circular openings 14, 16 and 17 in register with each other. As an alternate arrangement, the holder H may have four small openings therein 25 along with a single large circular opening 24. The object of the small green filters is to add magenta to the cyan dye coupler print. This may also be accomplished with equal results by the use of split filters, one portion being red and a smaller portion green. If the cyan contains too much magenta, one or more of the small green holes may be covered to obtain a correct amount of magenta dye to match the cyan printing ink. It is to be understood in this respect that the proper exposure may be obtained empirically by first exposing the film for X seconds, which upon development will give a certain densitometer reading. If this reading is not directly correlated with the dye coupler densitometer reading for cyan, then one or more of the green holes may be selectively covered as necessary to bring the print paper color into compliance with the cyan process ink. One particular example involves the provision of a unit wherein the combined area of the holes is such that when covered with a #29 Wratten red filter 18 and exposed ten seconds, upon development it will render a solid color patch with a density of 1.50 when read on the color densitometer. The above exposure just mentioned is made with a quartz halogen bulb of 22½ watts indicated at 19 (FIG. 1) at an exposure distance of 40 inches.

The holder just mentioned also is provided with enough aligned openings 21 for one set of one leaf, for instance leaf 10a, to be covered with green filter material such as for example #61 Wratten green. The areas of the openings for the green material 22 when combined are such, under the same exposure conditions just mentioned, to render a 0.60 magenta reading through the green filter on the reflection densitometer. By way of specific example, the large openings for the red material 18 in FIG. 5, may be on the order of ½ inch in diameter and the small openings 21 for the green material may be on the order of 3/32 inch in diameter. While three each of the large and small openings in FIG. 5 are shown, it will be apparent that the purpose can be as well served by making different numbers of openings, different diameters of openings, different shapes of openings, etc., the object being to subject the sensitive color paper to the correct proportion of red and green. Although this procedure is somewhat faster than with split-filters as described above, the same results may be accomplished by the use of a split-filter technique.

Figure 4:
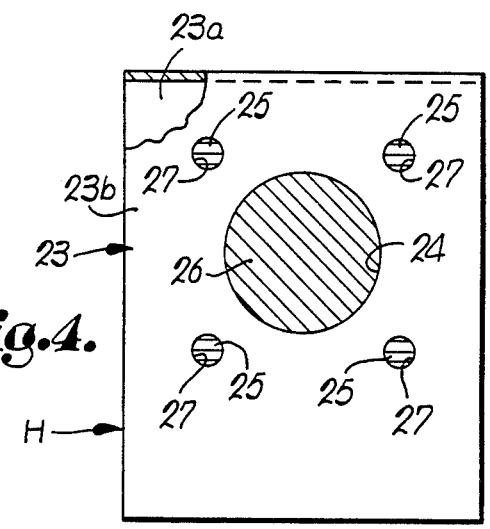

Referring now to FIG. 4 illustrating the magenta printer grid, the leaves of the holder 23 are provided with a large opening 24 and four small circular openings 25 in register with each other. The combined area of the holes is such that when the large hole 24 has a #61 green Wratten filter 26 and the four small holes have a #47B blue Wratten filter 25 and exposure carried out for a time of ten seconds, a solid magenta color patch having a density of 1.20 is produced when read on the color densitometer. The combined areas of the small holes 27 when covered with a #47B Wratten filter 25 should render, under the same exposure above mentioned and on the magenta solid patch, through the blue filter, a 0.48 yellow reading. The object of the four small blue filter holes is to add yellow to the magenta dye coupler print upon development thereof. If the magenta contains too much yellow, one or more of the blue filter holes may be covered to obtain a lesser and required amount thereof to match the hue error of the magenta printing ink.

Figure 3:
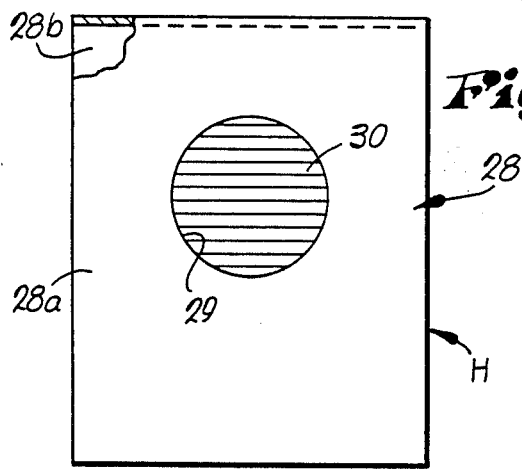
FIGS. 3–6, inclusive, are plan views of a series of holders with filters inserted therein and representing respectively a filter for the yellow printer, magenta printer, cyan printer and black printer.

Referring now to FIG. 3, a yellow printer filter grid 28 having leaves 28a and 28b is shown. This grid has aligned single large holes 29, one hole of which is covered with a #47B Wratten filter 30. The diameter of the hole 29 is such that its area will pass a volume of light which when exposed as above set forth and developed renders a density of 1.20 on the reflection densitometer when read through the blue filter. The yellow coupler dye needs no addition of light through red or green filters—in fact, the yellow dye coupler requires that magenta be removed to match the printing ink yellow. This is accomplished by dye transfer procedures as described hereinafter.

Figure 6:
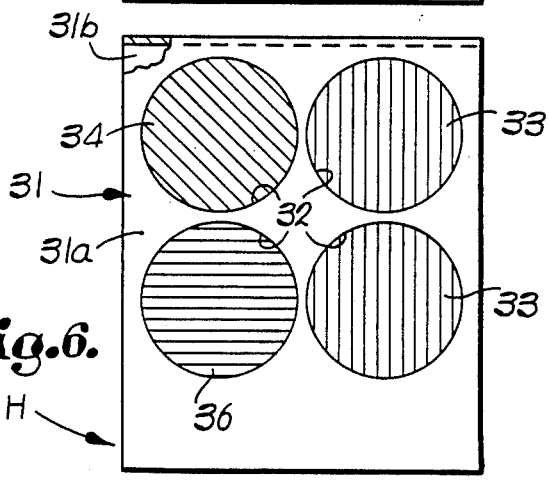

Referring now to FIG. 6 illustrating the black filter grid printer 31, the holder is provided with holes 32 of sufficient diameter and sufficient number so that when covered with the red, green and blue filters 33, 34 and 36 as shown and when exposed as above stated, will render a density of 1.50, respectively, through the three filters on the reflection densitometer.

From what has just been described, it will be seen that the operator now has in his possession and ready for use a set of filter grids which are in effect tailored to his own, individual process inks.

Referring to FIG. 1, equipment to be used in total dark, for exposing the color print paper used to make the color pre-proof is illustrated. This figure also illustrates placing the appropriate size sheet of color print paper 37 on the pins carried by a vacuum easel shown diagrammatically at 38. As will be understood, the negative halftone 39 illustrated in FIG. 1 also has holes which will register with the pins 41. The negative halftone 39 is now placed in intimate contact with the upper surface of the color print paper, on the pins 41. If, by way of example, the negative halftone 39 selected for first exposure is the cyan negative, then the red filter grid as shown in FIG. 5 should be placed in the holder 42 of the diffused light source indicated as a whole by the numeral 43 (FIG. 1) and exposed for approximately ten seconds.

Figure 7:
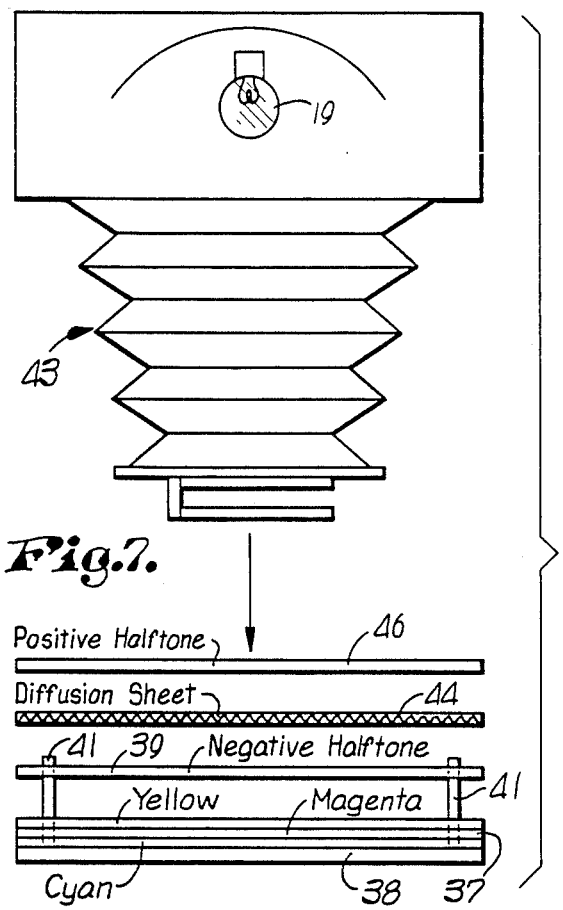
FIG. 7 is a wholly diagrammatic partially exploded view, exaggerated as to thickness, illustrating the first step in exposing the color print paper through my improved filter grid and a negative halftone.
Figure 8:
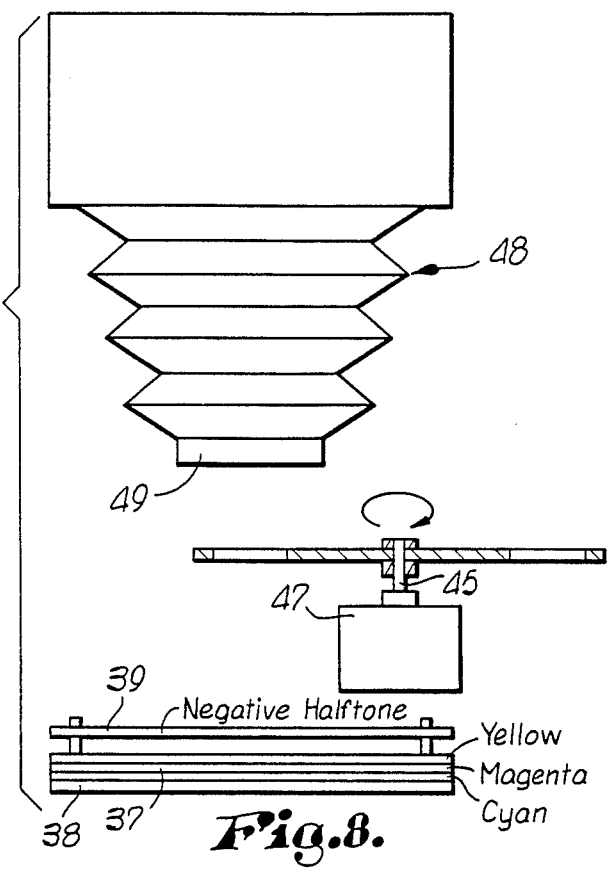
FIG. 8 is a modification showing the method of employing the improved filter system in color disc or wheel form and FIGS. 9–12, inclusive, are, respectively, plan views of the improved filter system incorporating color discs or wheels for the yellow printer, magenta printer, cyan printer and black printer.
Figure 9:
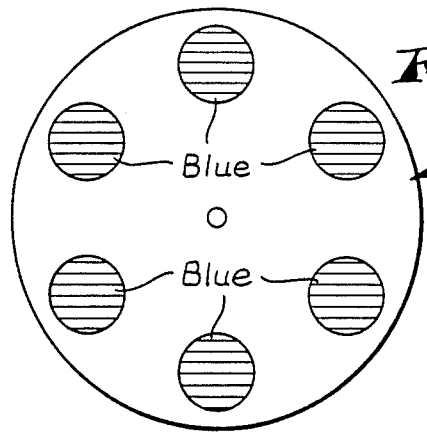
Figure 11:
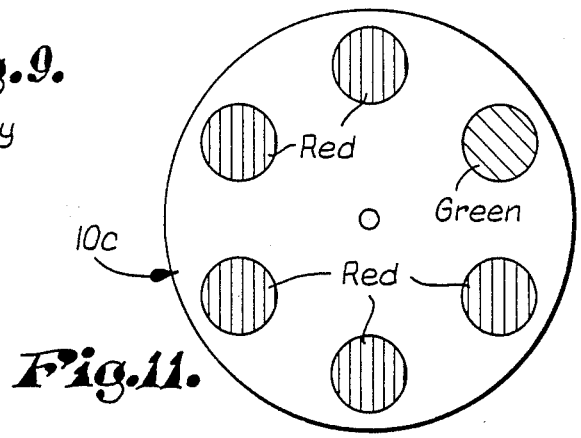
Figure 10:
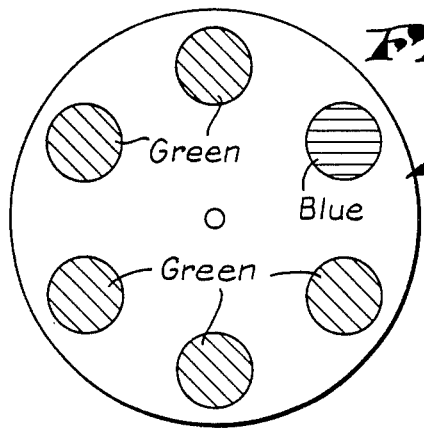
Figure 12:
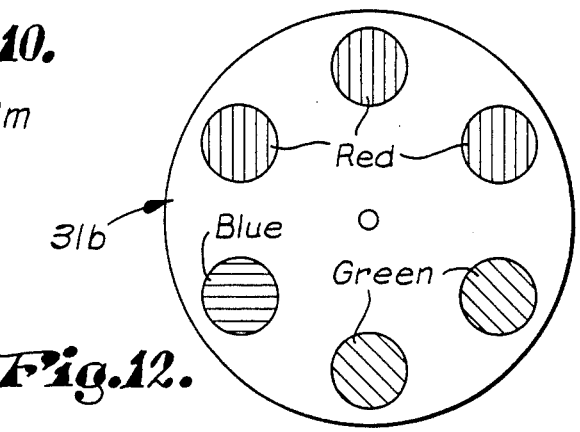

The next step is illustrated in FIG. 7 of the drawings. That is to say, with the cyan negative halftone 39 still in place on the pins, a diffusion sheet 44 is placed on top of the cyan negative halftone 39 and on top of the diffusion sheet, also in register with the pins, the positive cyan halftone 46 in intimate contact. The light source 19 is activated and the sandwich thus provided is exposed for approximately ten additional seconds. It will be understood that the intensity of the light and exposure distance are as above indicated.

The sequence of steps just described continues through the remaining two other exposures, namely, through the magenta and yellow printer grids 23 and 28 utilizing the appropriate halftone negatives, positives and diffusion sheet. It will be understood that the respective positive is used with the respective negative.

After the last exposure is made the color print paper is developed in the dark room. Any of the well-known methods of developing may be employed. However, the operator should be careful in developing to use consistent procedures and controlled conditions.

The reason for a diffusion sheet between each halftone positive and the halftone negative is to prevent moire on color halftone pre-press proof. The foregoing operations result in the production of a pre-press color proof which serves as a visual check for the operator against the original and which may be supplied to the customers for approval. The primary objective of reproduceability of the pre-press proof on the press is assured because the dyes in the color print paper have been substantially modified in general accordance with the known hue error characteristics of the printing inks to be used.

Referring now to FIGS. 8 to 12, inclusive, a slightly modified form of the filter grids is shown. In these figures, the grids are shown as being of disc configuration with the colors arranged as indicated, 10C (cyan), 23M (magenta), 28Y (yellow) and 31B (black). This type of disc may be used with a lens rather than using a diffused light source and may be made of relatively rigid material. Thus, the discs may be mounted on the axle 45 of a constant speed motor 47 and rotated in the direction of the arrows, thus to bring the colors indicated on the drawing sequentially under a light beam emanating from a camera 48 or light source equipped with a lens 49. Except for the physical shape and the rotation of the filter discs, the use of the same is as already described.

A modified use to which the invention may be put involves the ability to make halftone pre-press proofs using the original color transparencies or flat art as the positive rather than a halftone positive. This can be done by placing the halftone negative on the light grid device as shown in FIG. 1 and exposing onto the color print paper through the approximate color filter grids. Then, the sandwich of halftone negative and color print paper is removed and placed on the pins whereupon the paper is exposed again to transmitted light projected through the color transparency or reflected projection from the original art utilizing the appropriate filters. As will be apparent, this procedure is in effect the same thing as using the positive halftone for the second exposure as has already been explained. No diffusion sheet is required.

The tone range of dyes on the photographic color print paper should closely match press tone range of inks printed on paper—it is known that there is a need to extend from solid color in shadow to small dots in highlights on dye image to conform to range on printed sheet. In view of the fact that the photographic color print paper is not normally capable of rendering a contrast tone range great enough to do this, the tone range of the dye coupler colors on the paper are extended to bring the same into compliance with the press tone range, shadow to highlight. Specifically, after the first exposure through the negative to the print paper from the light source which will be described hereinafter, an additional exposure is made by leaving the negative in place and placing thereover and into register therewith a halftone positive of the subject plus a diffusion sheet and making an additional exposure through the sandwich thus formed. It has been discovered that this extends the tone range of colors to enhance highlight detail and also adds midtone dot gain while holding shadow solid at required strength. Each dye image will conform to the tone range of the image when printed by ink on paper later.

Optionally color correction in the dyes to nearer match printing inks can be made by use of halftone positive of complementary filter color to the negative halftone. For example, after exposure is made using the yellow halftone negative onto the color print paper, a second exposure is made using a diffusion sheet and the cyan positive on top of the yellow negative for the exposure. This will hold back yellow dot gain in cyan while all other colors will show dot gain and more closely match midtones of printing press sheet dot gain, thus gaining color correction of yellow in cyan.

In similar measure, the yellow positive may optionally be used on top of the magenta negative along with a diffusion sheet, for the second exposure. This is to prevent dot gain of magenta in yellow, light orange, and red colors and allow gain in all other colors to show dot gain in midtones to match press sheet dot gain, thus gaining added color correction of magenta in yellow.

Likewise, the magenta positive on top of the cyan negative along with a diffusion sheet for the second exposure may optionally be used to prevent dot gain of cyan in magenta, red, and blue while allowing dot gain in midtones of all other colors to more closely match press dot gain.

Without the dot gain in the dye proof midtones, the press would print ink fuller in midtones on the paper than the pre-press proof. Press inks do have dot gain as a natural action transferring from one blanket cylinder to the next during the printing press operation.

Generally speaking, the order of printing sequence on a press is: black-cyan-magenta-yellow. It is important to know which color will go on which unit of a multicolor press. If a four-color press is being operated in the sequence of colors indicated, the following times are typical of those which may be used on each second exposure only to provide the required dot gain in the pre-press proof (X equalling one unit of time as determined by the first exposure through the compensating filters described above):

First Printing Unit—2½X
Second Printing Unit—2X
Third Printing Unit—1½X
Fourth Printing Unit—1X It is to be understood that the times requires for each press will vary and must be determined empirically for each press unit.

The following descriptions are of specific processes involving successively greater matching of the pre-press proof colors of the print paper to the final printed image. Certain jobs do not require the same color accuracy and match in the pre-press proof as is the instance with more precise job requirements. It depends in large measure upon the quality required for the job to be printed, whether or not the customer needs to approve the colors before printing, and the specifications established by each printer.

COLOR PRINT PAPER PRE-PROOF METHOD 0

When scanning (or separating on camera) a set of process four-color halftone positives for each Y-M-C-K are prepared. The halftone positives are registered to pins and a set of contact negatives made for each. Thus, four halftone negatives and four halftone positives of the color separations are available. The negatives are used for one exposure to obtain full scale images on the color print paper including solids. The halftone separation positives on top of respective negatives are used to obtain a second exposure providing extended range in highlight and to enlarge midtone dots to match dot gain on the press.

Before making the prints, it is helpful to notch the negatives and positives in such a way that it is known which color is being handled in the total darkness of the dark room. Such notching is conventional in dark room procedures. After notching of the halftone separations, they are placed on a work table by the light source in the order that they will be used for exposure of the color print film. Generally, the negatives should be placed to the left of the exposure easel and the positives to the right.

The filter grids previously described and illustrated in the drawings (blue, green and red) should also be laid out where they can be located and changed for ready use. Here again, it is desirable that the grids be suitably marked for identification under dark room conditions. Two notches from an edge of the yellow, one notch from the magenta and none from the cyan is recommended.

The steps described hereinafter, until otherwise indicated are to be carried out in the camera dark room.

EXPOSURES FOR CYAN

First Exposure

Place punched photographic color print paper on enlarger easel and pin register with emulsion side up.
Place cyan full scale halftone separation negative on register pins, emulsion down, on top of color print paper.
Place red color filter (cyan printer) grid in filter holder. This filter has one large red filter hole and four small green filter holes to add magenta to the cyan.
Set timer for first exposure. X exposure time determined beforehand. Turn on vacuum.
Turn exposure light on, then start timer (which controls shutter opening and closing).

Second Exposure

At the end of first exposure time, place on top of the cyan full scale halftone separation negative a diffusion sheet. Set the full scale cyan halftone separation positive diffusion sheet on top of the full scale cyan halftone negative.
Set timer for second exposure—2X first exposure approximately. (This increases tone range and dot size in midtones to duplicate press dot gain if cyan is the second unit of a four-color press.)
At the end of the exposure, turn the camera light off.
Remove the positive, the diffusion sheet and the negative. Do not remove print paper.

EXPOSURES FOR MAGENTA

First Exposure

Place the magenta full scale halftone separation negative on register pins, emulsion down, on top of color print paper.
Place green color filter (magenta printer) grid in filter holder. This filter has one large green filter hole and four small blue filter holes to add yellow to the magenta.
Set timer for first exposure. X exposure time determined beforehand.
Turn camera light on, then start timer (which controls shutter opening and closing).

Second Exposure

At end of first exposure, place diffusion sheet on top of the negative. Place full scale halftone magenta separation positive on top of the diffusion sheet.
Set timer for second exposure—approximately 1.5X first exposure time. (This increases dot in the midtones to duplicate dot gain on press if magenta is the third unit of a four-color press).
At the end of the exposure, turn the camera light off.
Remove the positive, diffusion sheet and negative and place the positive and negative out of the way. Do not remove color print paper.

EXPOSURES FOR YELLOW

First Exposure

Place yellow full scale halftone separation negative on register pins, emulsion down, on top of color print paper.
Place blue color filter (yellow printer) grid in filter holder. This filter has one large blue filter hole only.
Set timer for exposure time and expose for time X determined beforehand.

Second Exposure

At the end of first exposure, place diffusion sheet on top of the negative.
Then place the full scale halftone yellow separation positive on top of the diffusion sheet.
Set timer for second exposure time and expose for a time of only about 1X as determined beforehand because there is a lesser amount of dot gain to duplicate if yellow is the last unit of the press. If necessary, the time can be increased as required to provide adequate dot gain.
Remove the positive, diffusion sheet and negative. Do not remove the print paper.

EXPOSURES FOR BLACK

First Exposure

Place black full scale halftone separation negative on register pins with emulsion side down and on top of the print paper.
Set time for exposure through blue filter grid and turn on light and expose for approximately the same time used to expose the yellow separation negative.
Remove the blue filter grid and replace with the green filter grid. Set timer and expose for approximately the same time used to expose the magenta separation negative.
Remove the green filter grid and replace with the red filter grid. Set timer and expose for approximately the same time used to expose the cyan separation negative.

Turn off enlarger light and remove the black negative. Exposures are now complete.

Remove the exposed print paper from the pins and place in a developing drum for processing machine which is light tight.

This completes the processing in the dark room under dark conditions.

DEVELOPING THE PRINT

Developing is preferably done in a unit such as a Beseler 11×14 revolving, oscillating drum, using Ektaprint 2 chemistry, or an automatic processor if the quantity of proofs to be made justifies such equipment.

The actual development steps are conventional in nature and may be carried out utilizing suitable photographic processing techniques of developing, fixing, bleach, wash and dry. The colors formed by dye coupling are completed resulting in a permanent pre-press proof which closely resembles the final printed product to be obtained from the press run.

COLOR PRINT PAPER PRE-PROOF METHOD 1

Subject Preparation

During scanning of a set of process four-color halftone positives, a short scale shadow yellow halftone separation is also prepared. The shadow knob of the electronic scanner is left in its normal position for the particular job while the highlight setting is moved from its normal approximate 5% highlight setting thereof to at least about 66% and preferably from 75% to 80% in order to obtain a short scale halftone separation. This has the effect of compressing the tone values of the separation to a point where highlight dots appear at what is normally a midtone dot area. As a result, there are no highlights and limited midtone dots which increase non-linearly to the shadow area when the negative is used to prepare a dye transfer matrix positive therefrom. The shadow area is that which accepts and is predominantly colored by the transfer dye.

If the full scale halftone positives or negatives for reproduction on the press are prepared without the aid of a scanner, or have been previously made without concomitant preparation of short scale negatives and positives, the equivalent thereof can be prepared by contacting the full scale halftone positive of yellow (and magenta and cyan if used) through a spacer consisting of a clear sheet of film, approximately 0.007 inch thickness, and overexposing the film and developing the same under conditions to obtain a closing in of the highlight areas and to produce a short scale of the shadow area as required.

The halftone yellow separation positives are registered to pins and a contact negative thereof made with high contrast film. This results in use of four halftone negatives and five halftone positives. The short scale yellow positive is used as a mask during subsequent exposures. As previously indicated, the full scale yellow, magenta and cyan positives are used to match dot gain on the press during printing and to provide extended tone range in the highlight areas.

EXPOSURES FOR MAGENTA, CYAN AND BLACK

These exposures are carried out under dark room conditions which are the same as described above in connection with Color Proof Method 0, assuming that only the yellow is subjected to a short scale color separation thereof. Proceed with exposures of magenta, cyan and black as carried out in Method "0". Then remove print paper after development and place in wash water. Hold for dye transfer to follow.

EXPOSURES FOR YELLOW (METHOD #1)

First Exposure

Place blue filter grid (composed of blue filter only) in filter holder.

Place yellow full scale halftone separation negative on register pins, emulsion down, on top of print paper.

Place diffusion sheet on top of yellow negative.

Place short scale shadow halftone yellow separation positive on top of diffusion sheet.

Set time for approximately 1X during first exposure time as determined beforehand and draw down vacuum.

Second Exposure

At the end of first exposure, place the full scale halftone yellow separation positive on top of the sandwich made up of the full scale negative, the diffusion sheet and the short scale shadow positive registered to the pins.

Set timer for second exposure time and again expose at approximately 1X first exposure time. (There is limited dot gain in this instance as yellow is usually the last unit of the press.)

At the end of the exposure, turn the camera light off. Remove the full scale positive, yellow short scale positive, diffusion sheet and full scale negative. Do not remove the color print paper.

PREPARATION OF DYE TRANSFER MATRIX OF SHORT SCALE HALFTONE SHADOW YELLOW NEGATIVE

The matrix is preferably prepared utilizing conventional matrix film such as Kodak No. 4150 and developed in Kodak tanning developer A and B.

In the dark room under red light, the matrix film is punched and placed emulsion down on an easel. The exposure may conveniently be made with an Omega D-5 enlarger at a height of 44 inches. The lens mount of the enlarger is removed and replaced with a filter holder for holding the special grids that are used in exposing the color prints but use no filter in grid opening.

The steps of preparing the matrix are as follows:

Draw vacuum.

Place previously prepared short scale yellow shadow halftone separation negative over the matrix film using register pins on the easel.

Turn enlarging lamp on and set timer and expose matrix to white light for approximately 1X exposure time determined beforehand (all matrices receive the same exposure and development time if more than one is prepared, e.g., when a magenta matrix is produced along with a yellow matrix).

Remove exposed matrix and place in developer, emulsion side up.

Develop for 2 minutes in equal amounts of the tanning developers A and B as per Kodak instructions in Kodak Pamphlet E-80. Developer A is Kodak Catalog No. 1465848 and Developer B is Kodak Catalog No. 1468571.

Immerse in a cool water rinse for 30 seconds.

Fix for 2 minutes in a non-hardening fixer.

Rinse three times for 30 second intervals in hot water (120° F.).

After third rinse, clean edges with fingernail to remove excess gelatin, and then rinse again.

Prepare a yellow transfer dye solution. A typical composition may comprise 27 ounces of distilled water, 2 ounces of Kodak yellow dye concentrate (Catalog No. 1466127) and 3 ounces of yellow dye buffer.

Pour the transfer dye solution into a suitable dye transfer tray. Also prepare two separate trays of 1% acetic acid.

Place the exposed matrix film in the yellow dye bath and rock tray for 5 minutes.

Remove the dyed matrix and place first in one of the 1% acetic acid solutions for one minute and agitate, then in the second solution and allow to set.

Remove dye coupler developed color print from the washing drum while still wet and register to pins on transfer board with emulsion side up. Squeegee off excess water and wipe edges with sponge dampened with a 1% acetic acid solution.

Remove matrix from the 1% acetic acid rinse bath and register to pins on transfer board with the emulsion side of the matrix against the emulsion of the color print film.

Roll the sandwich of the matrix and color print paper with a rubber roller until transfer of the dye to the print is obtained. At the end of 4 minutes, pick up one corner of the matrix and return it to the 1% acetic acid rinse water bath, or wash and hang to dry.

The dye transfer as described provides substantially contaminant free yellow to the shadow and midtone areas of the dye coupler dye image of the color print paper.

COLOR PRINT PAPER PRE-PROOF METHODS 2 AND 3

These methods are carried out as previously described with the exception that in the case of Method No. 3, short scale shadow halftone separations are scanned for each of the yellow, magenta and cyan color separations. As a result, eight halftone positives and eight halftone negatives are prepared. The three halftone shadow negatives are used to make three separate dye transfer matrices, Y, M and C, before the yellow, magenta and cyan filter correction exposures are carried out. The order of dye transfer to the dye coupler developed print sheet is preferably cyan, magenta and then yellow. The black is already on the color print by dye coupling. A useful magenta transfer dye may be prepared by combining 27 ounces of distilled water, 2 ounces of Kodak Catalog No. 1466143 magenta transfer dye concentrate, 3 ounces of magenta dye buffer and 10 milliliters of yellow dye concentrate. The cyan transfer dye is preferably formulated of 27 ounces of water, 2 ounces of cyan transfer dye concentrate Catalog No. 1466135, and 3 ounces of cyan transfer dye buffer which is then combined with 1 pod of Kodak cyan retouching dye prepared by dissolution thereof in water at 130° F.

The proof prepared in accordance with Method No. 3 is a very close match to SWOP (Standard Web Offset Publications) printing ink color hues used as a standard by the offset web publication industry. Method No. 2 involves only two transfer dye operations with the other color being dye coupling only. Generally speaking, Method No. 2 involves transfer of yellow and magenta, particularly if the subject to be printed has bright reds to be duplicated in the pre-press color print proof. Cyan dye coupler dyes are more closely matched to cyan process inks than is usually the case with respect to yellow and magenta process inks.

As previously explained, the dye coupler dyes in most color print films have an excess of magenta as compared with all process yellow inks. Similarly, dye coupler magenta has an excess of cyan as compared with SWOP process magenta ink. Cyan coupler dye may have somewhat of an excess of yellow as compared with SWOP cyan process ink. The present process allows compensation for such excess contaminants reducing hue errors to a successively greater degree of accuracy proceeding from Method No. 0 described toward Method No. 3, depending upon job requirements. Studies have shown that comparative results, based on densitometer readings made with a reflection densitometer equipped with Kodak Wratten filters blue 47B, green 58 and red 25, and with the values being converted to percentages for hue error, reflect exemplary values such as the following:

| | PROCESS INK | | |
|---|---|---|---|
| | Filters | | |
| | B | G | R |
| Percent Printing Process Ink Hues | | | |
| Yellow | 100 | 08 | 00 |
| Magenta | 30 | 100 | 08 |
| Cyan | 09 | 30 | 100 |
| Method No. 0 Coupler Dyes of Approximate Match to Inks | | | |
| Percent Dye Coupler Color Print Hues | | | |
| Yellow | 100 | 20 | 00 |
| Magenta | 30 | 100 | 15 |
| Cyan | 15 | 30 | 100 |

| DYE COUPLER DYES AND DYE TRANSFER DYES | | | |
|---|---|---|---|
| | B | G | R |
| Method No. 1 (Exact match yellow) | | | |
| Percent Dye Color Print Hues | | | |
| Yellow | 100 | 04 | 00 |
| Magenta | 30 | 100 | 15 |
| Cyan | 15 | 30 | 100 |
| Method No. 2 (Exact match yellow and magenta) | | | |
| Yellow | 100 | 04 | 00 |
| Magenta | 45 | 100 | 08 |
| Cyan | 15 | 40 | 100 |
| Method No. 1 (Exact match magenta) | | | |
| Percent Dye Color Print Hues | | | |
| Yellow | 100 | 20 | 00 |
| Magenta | 45 | 100 | 08 |
| Cyan | 15 | 40 | 100 |
| Method No. 3 | | | |
| (Exact match yellow, magenta and cyan) | | | |
| Yellow | 100 | 04 | 00 |
| Magenta | 45 | 100 | 08 |
| Cyan | 09 | 40 | 100 |

I claim:

1. A method of preparing a pre-press proof of an original subject having highlight, midtone and shadow tone areas using color print paper wherein the dyes of the print paper have been brought into substantial color compliance with the yellow, cyan and magenta process inks to be used in producing a lithographic reproduction of said original subject, and the tonal range of the proof image has been extended to closely match that of the final process ink print, said method comprising the steps of:

preparing yellow, cyan and magenta color half tone separation negatives and positives of the original subject to be reproduced;

separately placing the halftone negatives in sequential order over a sheet of color print paper sensitive to green, blue and red light respectively;

exposing the print paper sheet to light passed through a blue filter when the yellow halftone separation negative is over the print paper sheet, a red filter when the cyan halftone separation negative is over the print paper sheet, and a green filter when the magenta halftone separation negative is in place thereover, said exposure of the print paper sheet being carried out with each halftone separation negative in place over the print paper sheet for a predetermined time period sufficient to cause the dyes of the print paper sheet upon development thereof to exhibit densitometer readings wherein through a blue filter, the yellow reading of the exposed print paper relatively closely matches the yellow reading obtained by densitometer measurement through a blue filter of the yellow process ink, through a green filter the magenta reading of the exposed print paper relatively closely matches the magenta reading obtained by densitometer measurement through a green filter of the magenta process ink, and through a red filter the cyan reading of the exposed print paper relatively closely matches the cyan reading obtained by densitometer measurement through a red filter of the cyan process ink;

during exposure of the print paper sheet to light through a red filter while the cyan halftone separation negative is over the print paper sheet, also exposing the print paper sheet to light through a green filter for a sufficient period of time to cause the dyes of the print paper sheet upon development thereof to exhibit a densitometer reading wherein the magenta reading through a green filter relatively closely matches the magenta contaminant reading obtained by densitometer measurement through a green filter of the cyan process ink, during exposure of the print paper sheet to light through a green filter while the magenta halftone separation negative is in place over the print paper sheet, also exposing the print paper sheet to light through a blue filter for a sufficient period of time to cause the dyes of the print paper sheet upon development thereof to exhibit a densitometer reading wherein the yellow reading through a blue filter relatively closely matches the yellow contaminant reading obtained by densitometer measurement through a blue filter of the magenta process ink; and increasing the tonal range of the color print paper proof by also placing on the print paper sheet when the magenta separation halftone negative is associated therewith, the magenta halftone separation positive, and the yellow halftone separation positive on the print paper sheet when the yellow halftone separation negative is associated with the print paper sheet, and the cyan halftone separation negative on the print paper sheet with the cyan separation halftone positive, and in each instance passing additional light through the red, green and blue filters respectively for time periods sufficient to progressively extend the tonal range of the highlight and midtone areas of the film proof without unduly affecting the shadow tone area thereof.

2. A method as set forth in claim 1, wherein is included the steps of passing light through the red and green filters while the cyan halftone negative and the cyan halftone positive and the magenta halftone negative and magenta halftone positive respectively are on the print paper sheet for a longer period of time than light is passed through the blue filter while the yellow halftone negative and yellow halftone positive are on the print paper sheet.

3. A method as set forth in claim 2, wherein said longer time period is approximately two to four times the exposure time period through the yellow halftone negative and yellow halftone positive on the print paper sheet.

4. A method as set forth in claim 1, wherein is included the steps of preparing a halftone color separation negative for a selected one of the process inks which is of shorter scale than the first mentioned half tone separation negative of such process ink, using the short scale and negative to prepare a dye transfer matrix thereof, dyeing the image defining portions of the matrix a color corresponding to the selected process ink, and transferring the dye on the matrix to the print paper sheet after development thereof.

5. A method as set forth in claim 4, wherein is included the steps of preparing at least two separate short scale half tone negatives of different process inks, using such negatives to prepare separate dye transfer matrices thereof, dyeing the image defining portions of the matrix colors corresponding to the selected process inks respectively, and successively transferring the dyes on said matrices to the print paper sheet after development thereof.

6. A method as set forth in claim 4, wherein said step of preparing the short scale halftone separation negative includes enhancing and increasing the tone detail of the highlight and midtone portion of the scale without substantially disturbing the shadow portion of such scale.

7. A method as set forth in claim 4, wherein said step of preparing the short scale halftone separation negative includes subjecting the original work to color separation on an electronic scanner with the highlight setting thereof being established at a value of at least about 66%.

8. A method as set forth in claim 4, wherein said step of preparing the short scale halftone separation negative includes subjecting the original work to color separation on an electronic scanner with the highlight setting thereof being established at a value of about 75% to 80%.

9. A method as set forth in claim 7, wherein said scanning is carried out with the shadow setting thereof at its normal value.

10. A method as set forth in claim 4, wherein said step of preparing the short scale halftone separation negative includes placing a clear spacer sheet over a layer of light sensitive film disposing a full scale halftone separation positive of the halftone separation negative of said selected process ink over the spacer and overexposing the film to an extent to decrease the highlight and midtone area detail while enhancing the shadow tone detail.

11. A method of preparing a pre-press proof of an original subject using color print paper wherein the dyes of the print paper have been brought into substantial color compliance with the yellow, cyan and magenta process inks to be used in producing a lithographic reproduction of said original subject, said method comprising the steps of:

exposing the print paper to light through blue, green and red filters for times correlated to cause the print paper to exhibit densitometer readings for yellow, cyan and magenta through respective filters which substantially correspond to densitometer readings for the yellow, cyan and magenta process inks to be used in reproduction of the original subject through each of said filters;

preparing a short scale halftone color separation negative of at least a selected one of the process colors;

using the short scale halftone negative to prepare a dye transfer mix therefrom;

dyeing the image defining portions of the matrix with a transfer dye having a color corresponding to the selected process ink; and transferring the dye on the matrix to the color print paper after the development of such paper.

12. A method as set forth in claim 11, wherein said step of preparing a short scale halftone separation negative includes masking the image reproduced on a graduated scale basis with a greater proportion of the shadow tone areas being masked than that of the highlight areas.

* * * * *

UNITED STATES PATENT AND TRADEMARK OFFICE
CERTIFICATE OF CORRECTION

PATENT NO. : 4,553,835

DATED : November 19, 1985

INVENTOR(S) : James T. Morgan, Jr.

It is certified that error appears in the above-identified patent and that said Letters Patent is hereby corrected as shown below:

In column 17, lines 65, delete "red, green and blue" and substitute therefore --green, blue and red--.

Signed and Sealed this

Tenth Day of February, 1987

Attest:

DONALD J. QUIGG

*Attesting Officer*

*Commissioner of Patents and Trademarks*